(12) United States Patent
Kim

(10) Patent No.: US 10,733,049 B2
(45) Date of Patent: Aug. 4, 2020

(54) SEMICONDUCTOR DEVICE AND ERROR MANAGEMENT METHOD

(71) Applicant: SK hynix Inc., Icheon-si, Gyeonggi-do (KR)

(72) Inventor: Woongrae Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 153 days.

(21) Appl. No.: 15/854,191

(22) Filed: Dec. 26, 2017

(65) Prior Publication Data

US 2018/0373594 A1 Dec. 27, 2018

(30) Foreign Application Priority Data

Jun. 26, 2017 (KR) ........................ 10-2017-0080536

(51) Int. Cl.
| | | |
|---|---|---|
| G06F 11/00 | (2006.01) | |
| G06F 11/10 | (2006.01) | |
| G11C 29/52 | (2006.01) | |
| G11C 29/42 | (2006.01) | |
| G11C 29/44 | (2006.01) | |
| G06F 12/02 | (2006.01) | |
| G11C 29/00 | (2006.01) | |

(52) U.S. Cl.
CPC ...... *G06F 11/1076* (2013.01); *G06F 11/1048* (2013.01); *G06F 12/0246* (2013.01); *G11C 29/42* (2013.01); *G11C 29/4401* (2013.01); *G11C 29/52* (2013.01); *G11C 29/76* (2013.01); *G11C 2029/4402* (2013.01)

(58) Field of Classification Search
CPC ............. G06F 11/1076; G06F 12/0246; G06F 11/1048; G11C 29/76; G11C 29/4401; G11C 29/42; G11C 29/52; G11C 2029/4402
USPC ................................ 714/702, 710, 718, 763
See application file for complete search history.

(56) References Cited

U.S. PATENT DOCUMENTS

| | | | | |
|---|---|---|---|---|
| 3,898,444 | A * | 8/1975 | Cordi ..................... | H03K 21/40 714/820 |
| 8,316,261 | B2 * | 11/2012 | Pfeiffer ............... | G06F 11/0715 714/38.1 |
| 9,575,862 | B1 * | 2/2017 | Hutton ................ | G06F 11/1004 |
| 2005/0160326 | A1 * | 7/2005 | Boatright .............. | G06F 11/073 714/47.3 |

(Continued)

*Primary Examiner* — Albert Decady
*Assistant Examiner* — Osman M Alshack
(74) *Attorney, Agent, or Firm* — William Park & Associates Ltd.

(57) ABSTRACT

An error management system may be provided. The error management system may include an error analysis unit configured to generate error correction counting values by counting error correction occurrences in a plurality of management blocks and generate permanent error block information for defining whether errors generated in the plurality of management blocks are a permanent error or a temporary error by comparing the error correction counting values and at least one reference value. The error management system may include a block control unit configured to replace an address signal with a new address signal when a management block selected according to the address signal among the plurality of management blocks is previously designated in the permanent error block information.

14 Claims, 7 Drawing Sheets

(56) References Cited

U.S. PATENT DOCUMENTS

| | | | |
|---|---|---|---|
| 2006/0282749 A1* | 12/2006 | Guo | H04L 1/0052 |
| | | | 714/776 |
| 2013/0103991 A1* | 4/2013 | Evain | G06F 11/1012 |
| | | | 714/701 |
| 2013/0139033 A1* | 5/2013 | Yu | G06F 11/1048 |
| | | | 714/766 |
| 2014/0269109 A1* | 9/2014 | Kong | G11C 29/04 |
| | | | 365/189.07 |
| 2015/0067444 A1* | 3/2015 | Eguchi | G06F 11/1048 |
| | | | 714/766 |
| 2015/0171869 A1* | 6/2015 | Takehara | H03K 19/17764 |
| | | | 365/154 |
| 2015/0199233 A1* | 7/2015 | Pelley | G06F 11/1076 |
| | | | 714/764 |
| 2015/0199234 A1 | 7/2015 | Choi et al. | |
| 2016/0284424 A1* | 9/2016 | Das | G11C 29/42 |
| 2017/0147416 A1* | 5/2017 | Ranjan | G06F 11/073 |

* cited by examiner

FIG.2
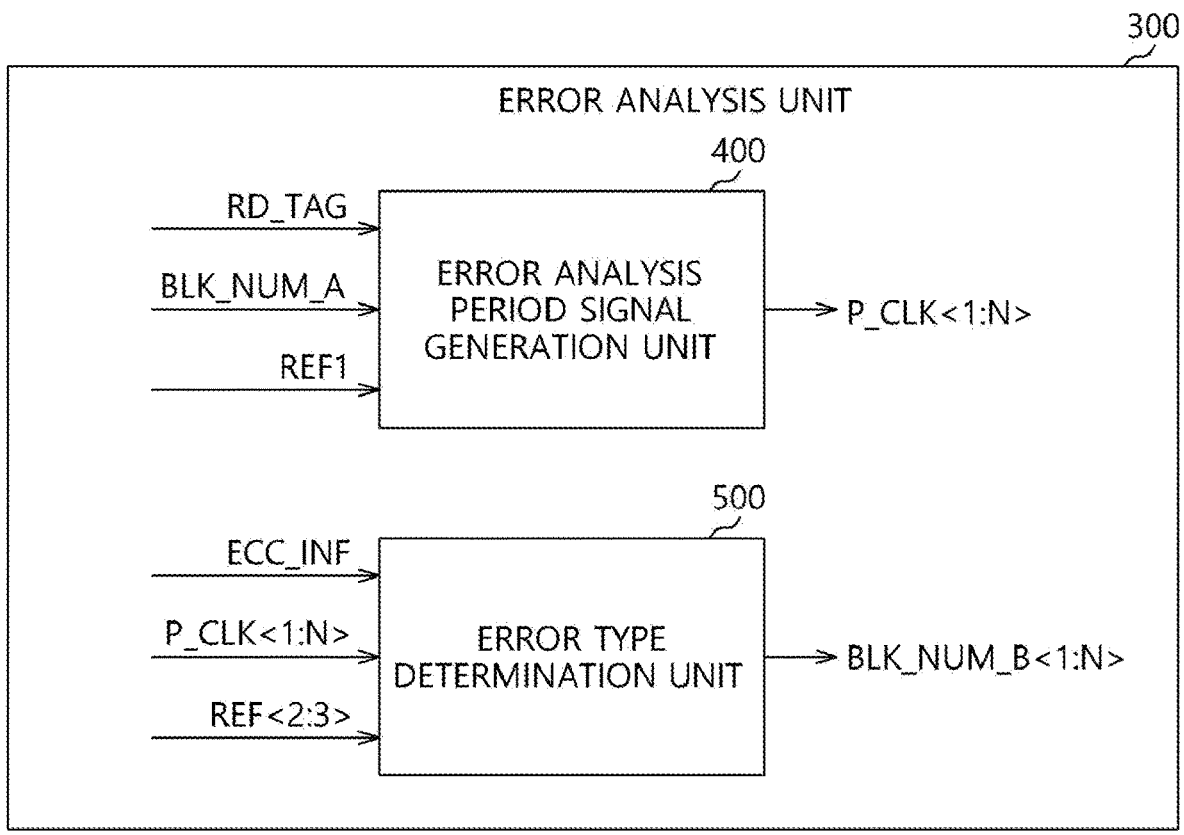
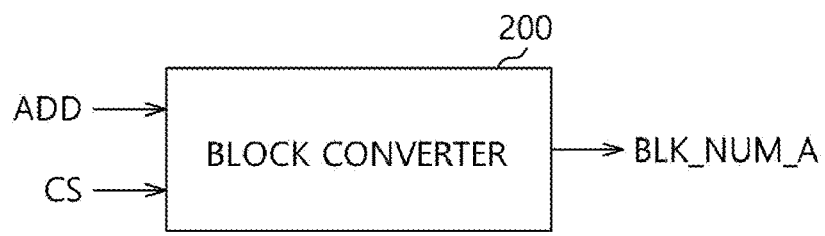

SEMICONDUCTOR DEVICE AND ERROR MANAGEMENT METHOD

CROSS-REFERENCES TO RELATED APPLICATION

The present application claims priority under 35 U.S.C. § 119(a) to Korean application number 10-2017-0080536, filed on Jun. 26, 2017, in the Korean Intellectual Property Office, which is incorporated herein by reference in its entirety.

BACKGROUND

1. Technical Field

Various embodiments may generally relate to a semiconductor device, and more particularly, to an error management system, a data processing system including the same, and error management method.

2. Related Art

Various types of data errors (hereinafter, referred to as errors) may occur in general memory systems under real use environments, even after the memory systems are shipped as products that have been through sufficient tests in a fabrication stage.

These errors may be divided into a temporary error and a permanent error.

The temporary errors may be an error which temporarily occurs according to a temporary operation or an operation environment and the permanent errors may be a physical error of a memory cell, for example, an error which cannot be restored to a normal state such as in the case of a gate oxide breakdown.

The memory systems may include error correction code (ECC) circuits configured to correct data bit according to an error.

A large number of errors occur in proportion to the memory capacity in systems which use a large number of memories, for example, server systems. However, there is no method for determining whether the occurred error is a temporary error or a permanent error and thus the error may not be efficiently managed.

Accordingly, there is a need for technology development for analyzing an error and efficiently managing a memory region according to the analyzed error.

SUMMARY

In an embodiment of the present disclosure, an error management system may be provided. The error management system may include an error analysis unit configured to generate error correction counting values by counting error correction occurrences in a plurality of management blocks and generate permanent error block information for defining whether errors generated in the plurality of management blocks are a permanent error or a temporary error by comparing the error correction counting values and at least one reference value. The error management system may include a block control unit configured to replace an address signal with a new address signal when a management block selected according to the address signal among the plurality of management blocks is previously designated in the permanent error block information.

In an embodiment of the present disclosure, a data processing system may be provided. The data processing system may include a processor. The data processing system may include a memory system. The data processing system may include a memory controller. The data processing system may include an error management system. The processor, the memory system, the memory controller, and the error management system may be coupled through an input and output (input/output) (I/O) bus. A memory region of the memory system may be divided into a plurality of management blocks and the memory system may be configured to generate an error correction occurrence signal whenever error correction through an error correction code circuit occurs. The error management system may be configured to prohibit use of a management block corresponding to a permanent error by dividing errors generated in the plurality of management blocks into a temporary error and the permanent error through analysis of the errors using the error correction occurrence signal and replacing an address signal which designates the management block corresponding to the permanent error among the plurality of management blocks with a new address.

In an embodiment of the present disclosure, an error management method of an error management system may be provided. The method may include generating error correction counting values by counting the number of error correction occurrence signals in a plurality of management blocks and generating permanent error block information for defining whether errors generated in the plurality of management blocks are a permanent error or a temporary error by comparing the error correction counting values and at least one reference value. The method may include replacing an address signal with a new address signal when a management block selected according to the address signal among the plurality of management blocks is previously designated in the permanent error block information.

BRIEF DESCRIPTION OF THE DRAWINGS

FIG. 2 is a diagram illustrating a configuration of an error management system of FIG. 1.

DETAILED DESCRIPTION

Figure 1:
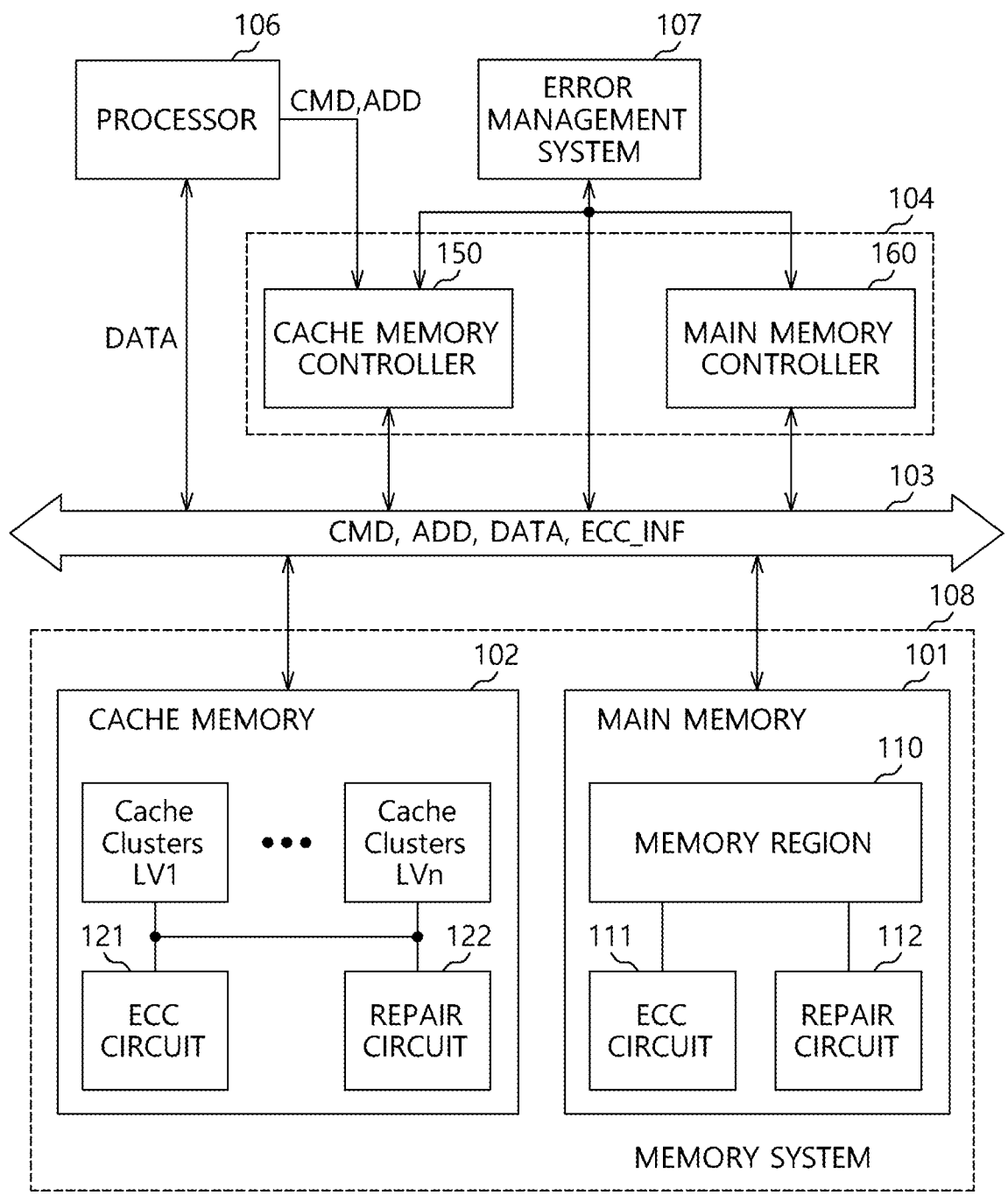
FIG. 1 is a diagram illustrating a configuration of a data processing system according to an embodiment of the present disclosure.

Various embodiments will be described below with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments. However, embodiments of the present disclosure should not be construed as limiting the concepts. Although a few embodiments will be illustrated and described, it will be appreciated by those of ordinary skill in the art that changes may be made in these embodiments without departing from the principles and spirit of the present disclosure.

Various embodiments may be provided to an error management system capable of effectively managing a memory region and a data processing system including the same.

A data processing system 100 according to an embodiment may include a memory system 108, an input/output (I/O) bus 103, a memory controller 104, a processor 106, and an error management system 107. In an embodiment, commands CMD, addresses ADD, and DATA may be transferred through the I/O bus 103. In an embodiment, a command may include, for example but not limited to, a read command RD and/or a write command, etc. In an embodiment, for example, a semiconductor device may include a data processing system 100.

The memory system 108 may include a main memory 101 and a cache memory 102.

The processor 106 may control an overall operation of the data processing system 100. In an embodiment, for example, the processor 106 may transmit commands CMD and addresses ADD to the memory controller 104. In an embodiment, for example the processor 106 may receive and transmit data DATA to and from the I/O bus 103.

The main memory 101 may include a memory region 110, an error correction code (ECC) circuit 111, and a repair circuit 112.

The main memory 101 may be configured of a volatile memory and/or a nonvolatile memory.

The ECC circuit 111 may perform an error correction operation on I/O data of the memory region 110.

The repair circuit 112 may perform a repair operation on the memory region 110. For example, the repair circuit 112 may replace a failure memory cell of the memory region 110 with a redundancy memory cell.

The main memory 101 may provide an error correction occurrence signal ECC_INF thereof to a main memory controller 160 or/and a cache memory controller 150 through the I/O bus 103.

The error correction occurrence signal ECC_INF may be generated whenever the ECC circuit 111 performs an error correction operation on the I/O data of the memory region 110.

The cache memory 102 may include cache clusters LV1 to LVn which are divided into a plurality of levels according to a size and usage thereof, an ECC circuit 121, and a repair circuit 122.

The ECC circuit 121 may perform an error correction operation on I/O data of the cache clusters LV1 to LVn.

The repair circuit 122 may perform a repair operation on the cache clusters LV1 to LVn.

The cache memory 102 may provide the error correction occurrence signal ECC_INF thereof to the cache memory controller 150 and/or and the main memory controller 160 through the I/O bus 103.

The error correction occurrence signal ECC_INF may include the number of times when an error correction operation on the I/O data of the cache clusters LV1 to LVn is performed in the ECC circuit 121.

The memory controller 104 may include the cache memory controller 150 and the main memory controller 160.

The cache memory controller 150 may control a data I/O operation of the cache memory 102. The cache memory controller 150 may perform a control operation including an operation for selecting one of the cache memory 102 and the main memory 101 which is to be preferentially used when a data read and write (read/write) command is transferred from the processor 106.

The main memory controller 160 may control the data I/O operation of the main memory 101.

Memory regions of the main memory 101 and the cache memory 102 may be divided into a plurality of management blocks in an embodiment and a size of each of the management blocks may be defined by the user according to a memory architecture, a user environment, a process, and the like.

The error management system 107 may divide errors generated in the plurality of management blocks into a temporary error and a permanent error through analysis of the errors using the error correction occurrence signal ECC_INF transmitted through the I/O bus 103 and may prohibit the management block corresponding to the permanent error from being used.

The error management system 107 may replace a currently input address signal ADD with a new address signal when the currently input address signal ADD is corresponding to a use-prohibited management block.

The plurality of management blocks may be independently set between the main memory 101 and the cache memory 102 or may be set without division of the main memory 101 and the cache memory 102.

The plurality of management blocks may be set in rank units, bank units, page units, or region units smaller than the rank, bank, and page units according to the needs.

Referring to FIG. 2, the error management system 107 according to an embodiment may include a block converter 200, an error analysis unit 300, and a block control unit 700.

The block converter 200 may generate active management block information BLK_NUM_A which defines a management block corresponding to the address signal ADD among the plurality of management blocks.

When the management block is N, the active management block information BLK_NUM_A may include bits corresponding to $\log_2^N$.

For example, when N is 64, the active management block information BLK_NUM_A may be configured of 6 bits.

In this example, when the active management block information BLK_NUM_A is '000000', the active management block information BLK_NUM_A may define a management block 1 (hereinafter, referred to as first management block) among the N management blocks and when the active management block information BLK_NUM_A is '000001', the active management block information BLK_NUM_A may define a second management block among the N management blocks. Similarly, when the active management block information BLK_NUM_A is '111111', the active management block information BLK_NUM_A may define a 64-th management block which is the last management block among the N management blocks.

The block converter 200 may generate the active management block information BLK_NUM_A which defines the management block corresponding to the address signal ADD when a chip select signal CS is activated. In an embodiment, for example, the block converter 200 may be configured to generate active management block information which defines any one of the plurality of management blocks according to the address signal ADD.

The address signal ADD to be described later may be an address signal received from an outside of the error management system 107 and a portion of signal bits constituting the address signal ADD may be used to generate the active management block information BLK_NUM_A.

The error analysis unit 300 may generate error correction counting values by counting the number of error correction occurrence in the plurality of management blocks and generate permanent error block information BLK_NUM_B<1: N> which define whether the errors generated in the plurality of management blocks are a permanent error or a temporary error by comparing the error correction counting values with at least one reference value.

The error analysis unit 300 may generate permanent error block information BLK_NUM_B<1:N> which defines management blocks in which the permanent error occurs by determining a type of an error generated in a management block designated by the active management block information BLK_NUM_A according to an error analysis period signal P_CLK<1:N>.

The error analysis unit 300 may include an error analysis period signal generation unit 400 and an error type determination unit 500.

The error analysis period signal generation unit 400 may generate the error analysis period signal P_CLK<1:N> according to a read tag RD_TAG, the active management block information BLK_NUM_A, and a first reference value REF1.

The read tag RD_TAG may be a signal internally generated according to an external read command RD. In an embodiment, for example, the read tag RD_TAG may be a signal internally generated according to a command CMD including a read command RD.

The first reference value REF1 may be a reference value for determining the number of times when the read command RD is input.

Bits constituting the error analysis period signal P_CLK<1:N> may correspond to the plurality of management blocks.

For example, the bits of the error analysis period signal P_CLK<1:N> may correspond to N management blocks.

The error type determination unit 500 may generate the permanent error block information BLK_NUM_B<1:N> according to the error correction occurrence signal ECC_INF, the error analysis period signal P_CLK<1:N>, and second and third reference values REF<2:3>.

The block control unit 700 may generate an address signal ADDN controlled according to the active management block information BLK_NUM_A, the permanent error block information BLK_NUM_B<1:N>, a chip select signal CS, and the address signal ADD.

The controlled address signal ADDN may have a different value from the address signal ADD (i.e., new address signal) or may have the same value as that of the address signal ADD. In an embodiment, for example, the block control unit 700 may be configured to replace an address signal ADD with a new address signal (i.e., controlled address signal ADDN including a different value from the address signal ADD) when a management block selected according to the address signal ADD among the plurality of management blocks is previously designated in the permanent error block information BLK_NUM_B<1:N>.

Figure 3:
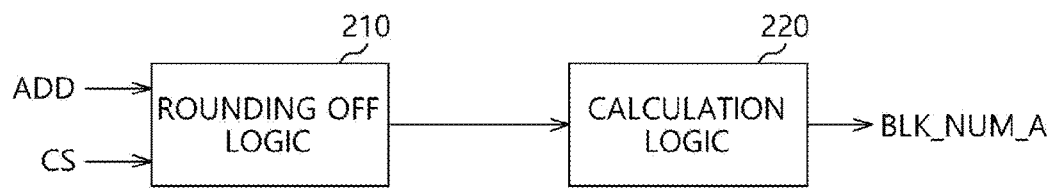
FIG. 3 is a diagram illustrating a configuration of a block converter of FIG. 2.

Referring to FIG. 3, the block converter 200 may include a rounding off logic 210 and a calculation logic 220.

The rounding off logic 210 may output the address signal ADD by removing a portion of bit signals constituting the address signal ADD when the chip select signal CS is activated.

As described above, the plurality of management blocks may be divided in units of ranks, banks, pages, and the like in the embodiments, but the address signal ADD may include signal bits for designating the management blocks even in memory cell units. Accordingly, a portion of the total signal bits constituting the address signal ADD may not be necessary.

Accordingly, the rounding off logic 210 may output the address ADD by removing a portion of the signal bits of the address signal ADD which is not involved in generation of the active management block information BLK_NUM_A.

The calculation logic 220 may calculate which bits of the address signal provided from the rounding off logic 210 correspond to which management blocks among the plurality of management blocks and output a calculation result as the active management block information BLK_NUM_A.

Figure 4:
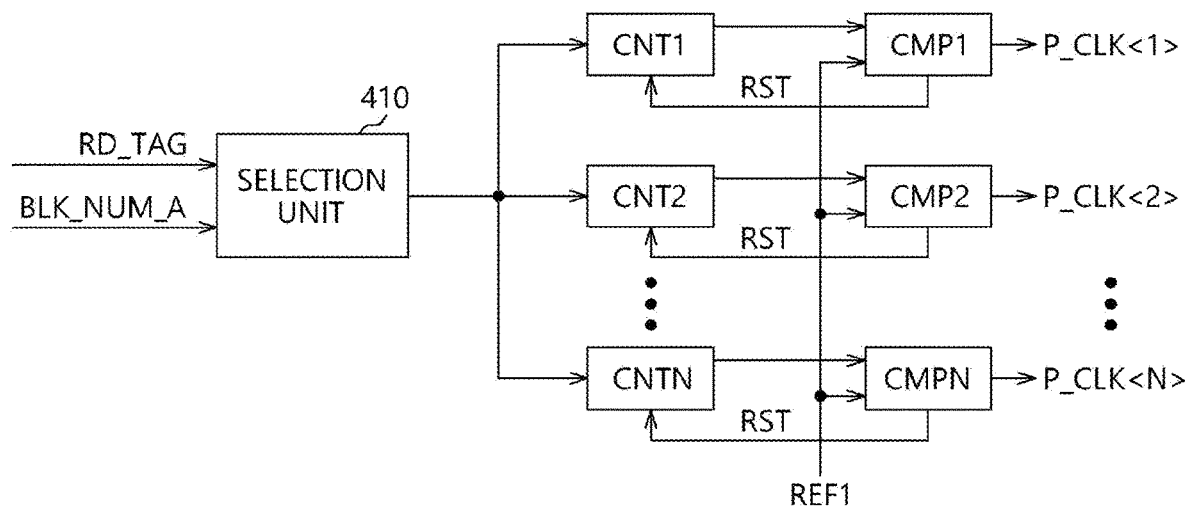
FIG. 4 is a diagram illustrating a configuration of an error analysis period signal generation unit of FIG. 2.

Referring to FIG. 4, the error analysis period signal generation unit 400 may include a selection unit 410, a plurality of counters CNT1 to CNTN, and a plurality of comparators CMP1 to CMPN.

One of the plurality of counters CNT1 to CNTN and one of the plurality of comparators CMP1 to CMPN may be allocated to corresponding one of the plurality of management blocks in number order.

For example, the counter CNT1 and the comparator CMP1 may be allocated to a first management block (for example, management block 1), another counter CNT2 and another comparator CMP2 may be allocated to a management block 2, and similarly, another counter CNTN and another comparator CMPN may be allocated to a management block N.

The selection unit 410 may provide the read tag RD_TAG to a counter CNTi allocated to a management block defined by the active management block information BLK_NUM_A. Here, i is any one of 1 to N and it may be assumed in the embodiment that i is 1.

The counter CNT1 may count the read tag RD_TAG and output a counting value of the read tag RD_TAG.

The comparator CMP1 may activate the error analysis period signal P_CLK<1> corresponding to the management block 1 among the error analysis period signals P_CLK<1: N> when the counting value output from the counter CNT1 is equal to or larger than the first reference value REF1. For example, the error analysis period signal may be generated in a pulse form.

For example, it may be assumed that the first reference value REF1 is '10'. The comparator CMP1 may activate the error analysis period signal P_CLK<1> when the read tag RD_TAG is generated ten times, for example, the read command is input ten times.

When the counting value output from the counter CNT1 is equal to or larger than the first reference value REF1, the comparator CMP1 may initialize the counter CNT1 by activating a reset signal RST.

Through the above-described method, the plurality of counters CNT2 to CNTN and the plurality of comparators CMP2 to CMPN may generate the error analysis period signals P_CLK<2:N>.

Figure 5:
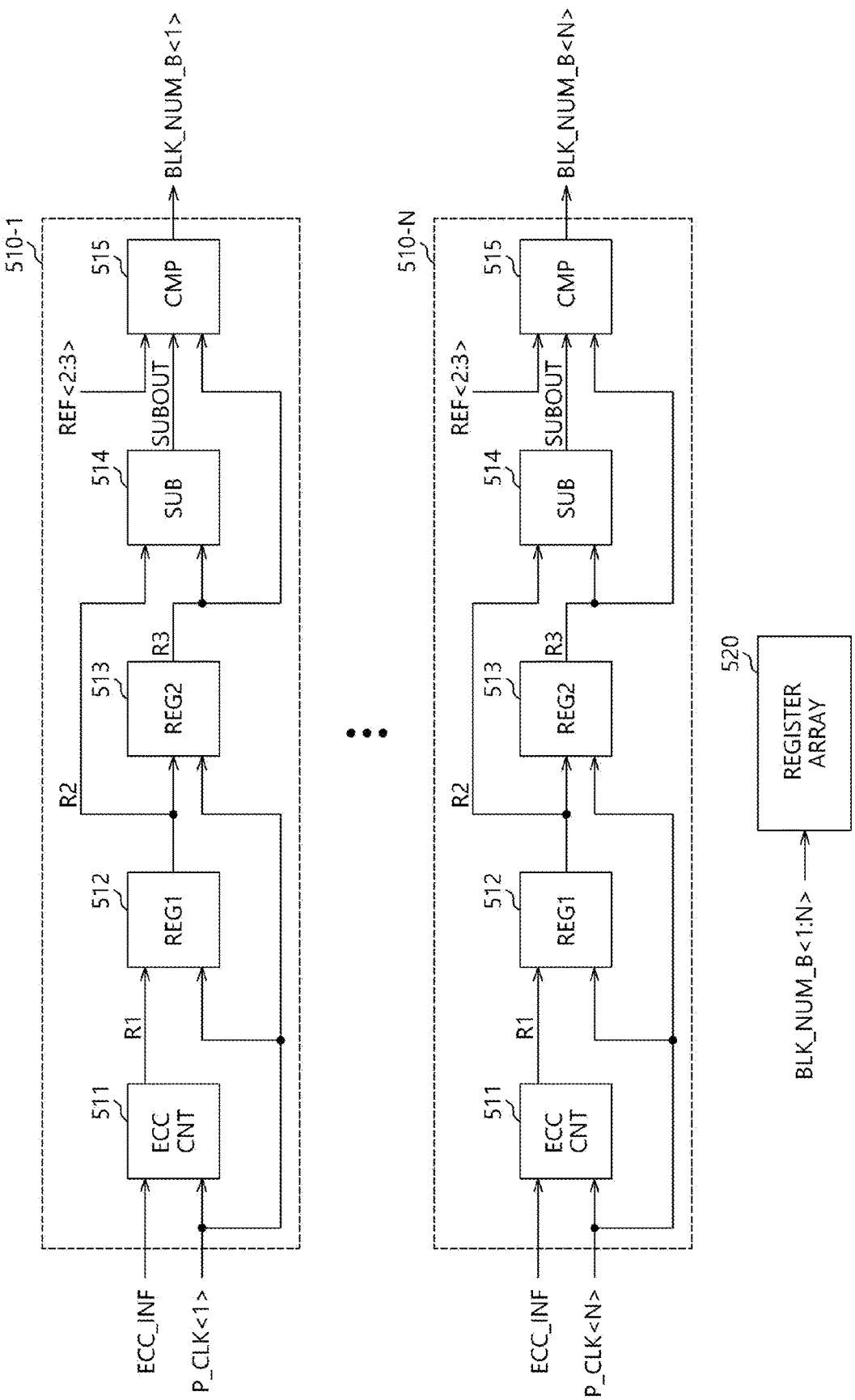
FIG. 5 is a diagram illustrating a configuration of an error type determination unit of FIG. 2.

Referring to FIG. 5, the error type determination unit 500 may include a plurality of error type determination units 510-1 to 510-N and a register array 520.

The plurality of error type determination units 510-1 to 510-N may have the same configuration as each other.

The error type determination unit 510-1 corresponding to a first management block among the plurality of error type determination units 510-1 to 510-N may include a counter (ECC CNT) 511, first and second registers (REG1 and REG2) 512 and 513, a subtractor 514, and a comparator 515.

The counter 511 may count the error correction occurrence signal ECC_INF.

The counter 511 may shift a counting value R1 of the error correction occurrence signal ECC_INF to the first register 512 and initialize the counting value R1 when the error analysis period signal P_CLK<1> is activated, for example, the error analysis period signal P_CLK<1> is toggled.

The first and second registers 512 and 513 may shift values stored therein to next stages and store input signals when the error analysis period signal P_CLK<1> is activated. In an embodiment, for example, the first and second registers 512 and 513 may be configured to sequentially shift an output of the counter 511 according to the error analysis period signal P_CLK<1> being activated.

The subtractor 514 may output a value that an output value R2 of the first register 512 is subtracted from an output value R3 of the second register 513 as a difference value SUBOUT. In an embodiment, for example, the subtractor 514 may be configured to generate a difference value SUBOUT between outputs (i.e., R2, R3) of a plurality of registers (i.e., REG1, REG2) included in an error type determination unit 510-1.

The comparator 515 may generate the permanent error block information BLK_NUM_B<1> by comparing the difference value SUBOUT and the output value R3 of the second register 513 with the second and third reference values REF<2:3>. In an embodiment, for example, the comparator may be configured to generate the permanent error block information BLK_NUM_B<1> by comparing the difference value SUBOUT and any one of the outputs (i.e., R2 or R3) of the plurality of registers (i.e., 512, 513) with second and third reference values REF<2:3>.

The permanent error block information BLK_NUM_B<1> may define whether an error generated in the first management block is a permanent error or a temporary error.

When the error generated in the first management block is the permanent error, the number of error correction occurrence may be increased over time as compared with the temporary error and thus the second reference value REF<2> may be set to a certain value suitable for determining the error.

When an absolute value of the number of error correction occurrence of the first management block is not large, the first memory block may be used through a repair operation and the like. However, when the absolute value of the number of error correction occurrence of the first management block is a certain level or more, the first memory block may not be difficult to be used and thus the third reference value REF<3> may be set to a certain value suitable for determining the error.

For example, a comparator 515 may output the permanent error block information BLK_NUM_B<1> having a certain level (for example, high level) defining that the error generated in the first management block is the permanent error when the difference value SUBOUT is larger than the second reference value REF<2> and the output value R3 of the second register 513 is larger than the third reference value REF<3>.

In another example, the comparator 515 may output the permanent error block information BLK_NUM_B<1> having a certain level (for example, low level) defining that the error generated in the first management block is the temporary error when the difference value SUBOUT is equal to or smaller than the second reference value REF<2> and the output value R3 of the second register 513 is equal to or smaller than the third reference value REF<3>.

Other error type determination units 510-2 to 510-N may output the permanent error block information BLK_NUM_B<2:N> having certain levels defining that errors generated in corresponding management blocks are the permanent error or the temporary error through the above-described method.

The register array 520 may store the permanent error block information BLK_NUM_B<1:N>.

Figure 6:
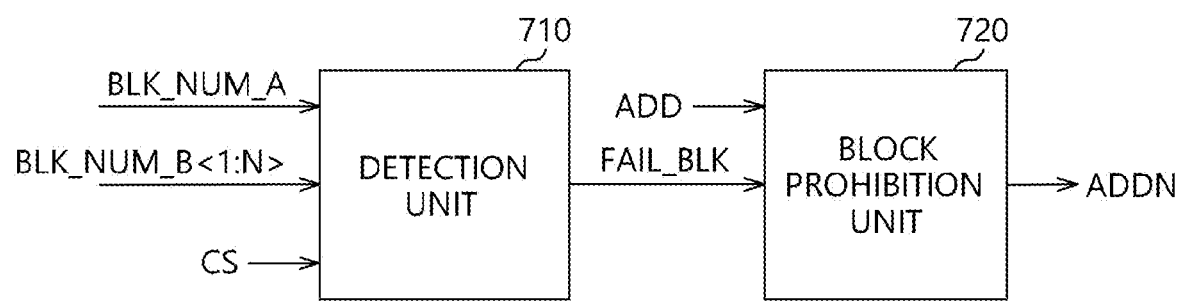
FIG. 6 is a diagram illustrating a configuration of a block control unit of FIG. 2.

Referring to FIG. 6, the block control unit 700 may include a detection unit 710 and a block prohibition unit 720.

The detection unit 710 may generate a permanent error flag FAIL_BLK by comparing the active management block information BLK_NUM_A and the permanent error block information BLK_NUM_B<1:N> when the chip select signal CS is activated.

The active management block information BLK_NUM_A may be information for designating a specific management block currently selected among the plurality of management blocks (for example, N management blocks).

The permanent error block information BLK_NUM_B<1:N> may be information for indicating whether or not the errors generated in the plurality of management blocks are a permanent error and thus a plurality of bits among N bits constituting the permanent error block information BLK_NUM_B<1:N> may have a high level.

Accordingly, when the bit of the permanent error block information BLK_NUM_B<1:N> corresponding to the management block designated by the active management block information BLK_NUM_A has a high level, the detection unit 710 may activate the permanent error flag FAIL_BLK.

For example, the detection unit 710 may notify that a currently selected management block is the same management block as the management block determined as the permanent error through previous error analysis by activating the permanent error flag FAIL_BLK.

The block prohibition unit 720 may block the use of the management block corresponding to the active management block information BLK_NUM_A by replacing the address signal ADD with the controlled address signal ADDN having a new value (i.e., different value from the address signal ADD) based on the memory use information when the permanent error flag FAIL_BLK is activated, for example, the permanent error flag FAIL_BLK has a high level.

The block prohibition unit 720 may bypass the address signal ADD when the permanent error flag FAIL_BLK is inactivated, for example, the permanent error flag FAIL_BLK has a low level.

Figure 7:
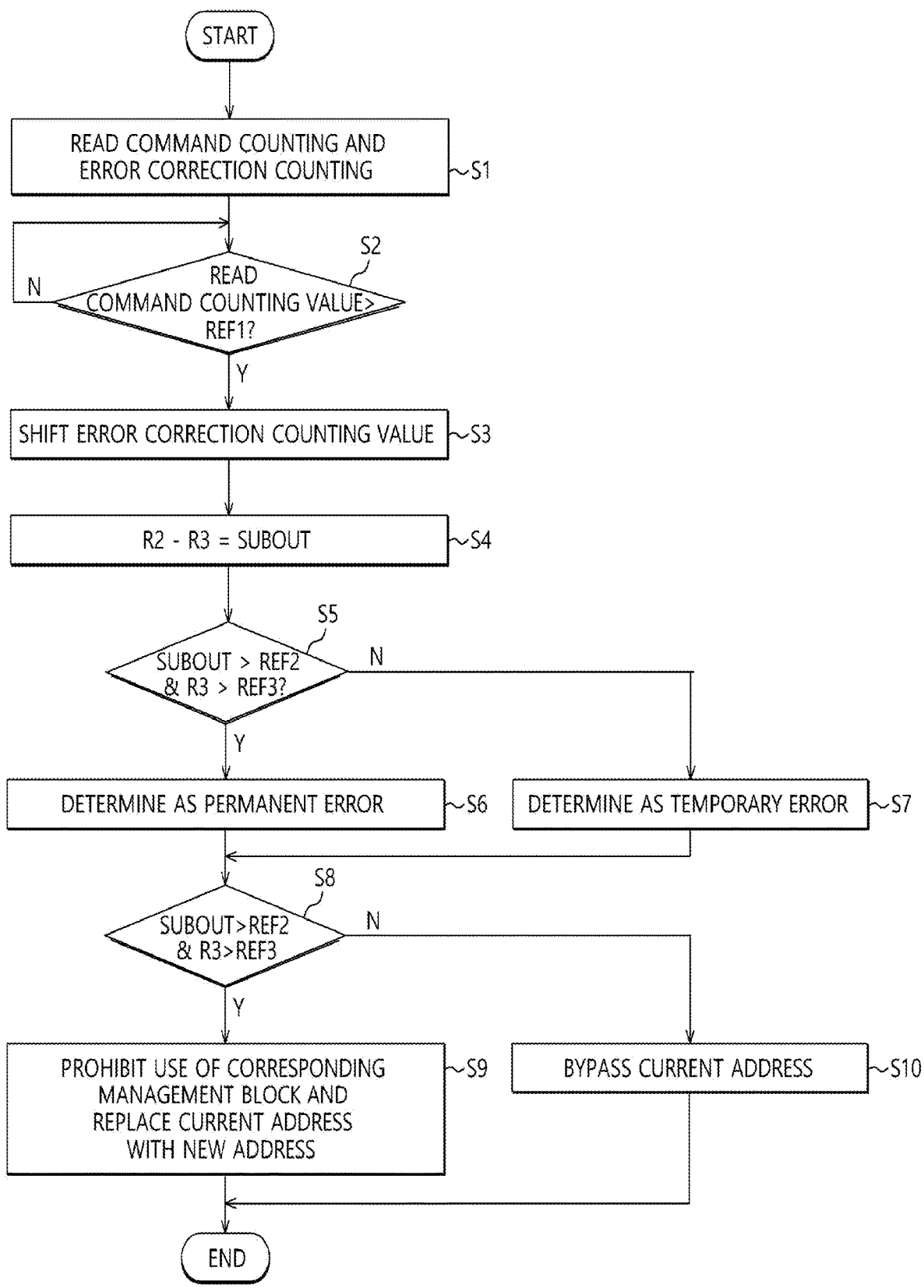
FIG. 7 is a flowchart illustrating an error management method according to an embodiment of the disclosure.
Figure 8:
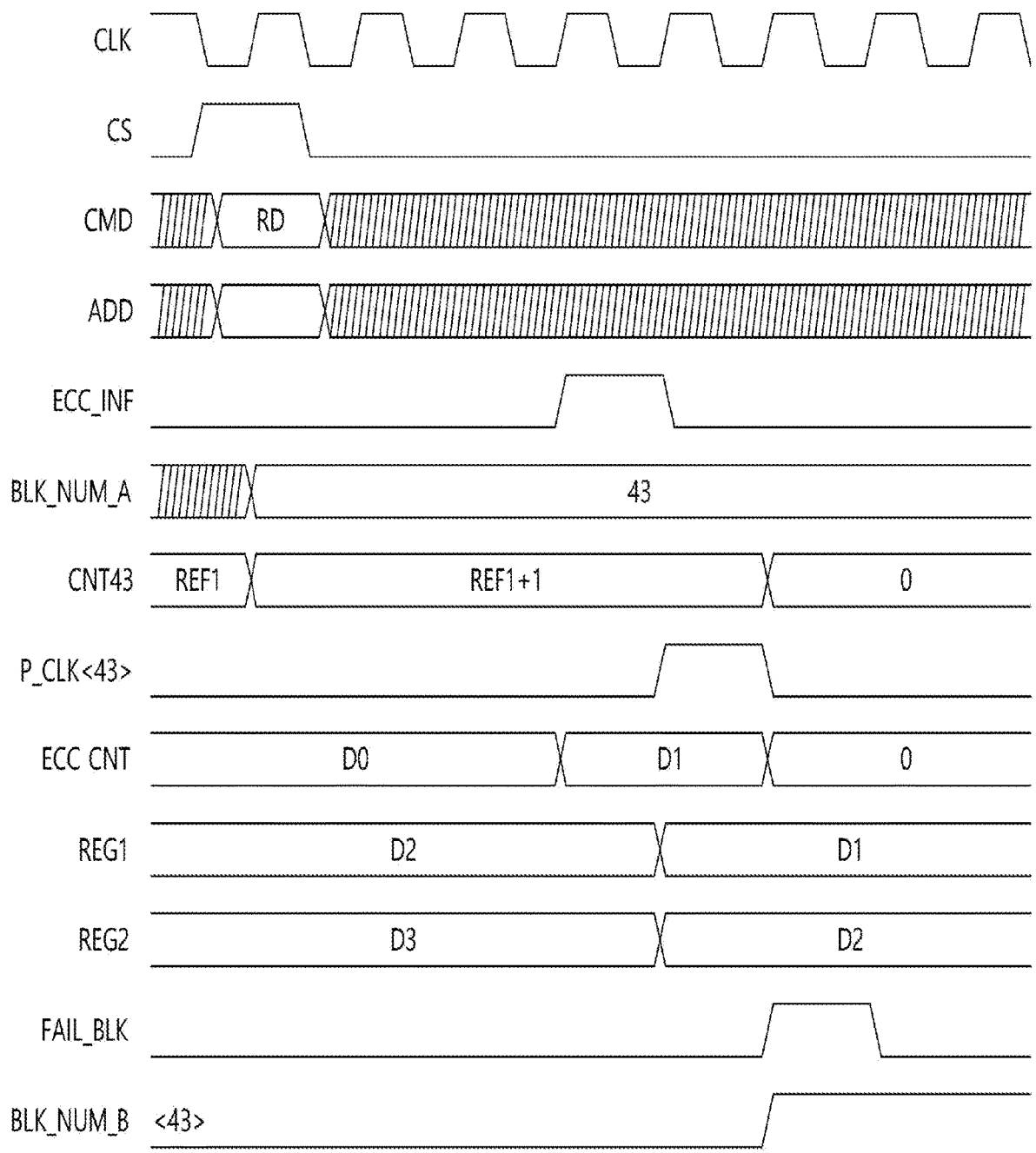
FIG. 8 is a timing diagram explaining an operation of an error management system according to an embodiment of the disclosure.

An error management method according to an embodiment will be described below with reference to FIGS. 7 and 8.

First, read command counting and error correction counting may be performed (S1).

The chip select signal CS may be activated based on a clock signal CLK and the read command RD and a corresponding address signal ADD may be input. The read command counting and the error correction counting may be performed in real time whenever a specific management block is designated according to the read command RD regardless of the plurality of management blocks. However, for clarity, it may be assumed that a management block 43 is selected according to the address signal ADD.

The error correction occurrence signal ECC_INF may be generated according to performing of a data read operation based on the read command RD.

The read command counting may be an operation CNT43 which counts the read tag RD_TAG generated according to the read command input according to the designation of the management block 43 and the error correction counting may be an operation which counts the error correction occurrence signal ECC_INF generated whenever the error correction is performed on the management block 43.

Next, an operation for determining whether or not a counting value of the read command is larger than the first reference value REF1 (S2).

When the read command counting value is larger than the first reference value REF1 (REF1+1) as a determination result in operation S2, the accumulated error correction counting value may be shifted until the error analysis period signal P_CLK<43> is generated (S3) (see FIG. 5).

The counter ECC CNT may increase a counting value thereof by counting the error correction occurrence signal ECC_INF (D0→D1) and initialize the counting value to "0 (zero)" according to the error analysis period signal P_CLK<43>. The first and second registers REG1 and REG2 may shift values stored therein to next stages according to the error analysis period signal P_CLK<43> (D2→D1, D3→D2).

The difference value SUBOUT between an error correction counting value of a current period (for example, the output value R2 of the first register 512) and an error correction counting value of a previous period (for example, the output value R3 of the second register 513 may be calculated (S4) (see FIG. 5).

An operation for determining whether or not the difference value SUBOUT is larger than the second reference value REF<2> and the output value R3 of the second register 513 is larger than the third reference value REF<3> is performed by performing a comparison operation (S5).

When the difference value SUBOUT is larger than the second reference value REF<2> and the output value R3 of the second register 513 is larger than the third reference value REF<3> as a determination result in operation S5, the management block 43 may be determined as a permanent error (S6).

When the difference value SUBOUT is equal to or smaller than the second reference value REF<2> or the output value R3 of the second register 513 is equal to or smaller than the third reference value REF<3> as the determination result in operation S5, the management block 43 may be determined as a temporary error (S7).

An operation for determining whether or not the management block 43 is the same management block as the management block determined as the permanent error through previous error analysis may be performed by comparing the active management block information BLK_NUM_A and the permanent error block information BLK_NUM_B<1:N> (S8).

When the management block 43 is the same management block as the management block determined as the permanent error through the previous error analysis as a determination result in operation S8, the use of the management block 43 may be prohibited and a currently input address may be replaced with a new address (S9).

When the management block 43 is not the same management block as the management block determined as the permanent error through the previous error analysis as the determination result in operation S8, the currently input address may be bypassed (S10) (i.e., the permanent error flag FAIL_BLK is inactivated).

The replaced address or the currently input address may be provided to the cache memory 102 or the main memory 101 through the cache memory controller 150 and/or the main memory controller 160 to perform an operation corresponding to a command CMD.

The above described embodiments of the present disclosure are intended to illustrate and not to limit the present disclosure. Various alternatives and equivalents are possible. The embodiments are not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. An error management system comprising:
an error analysis unit configured to generate error correction counting values by counting error correction occurrences periodically in a plurality of management blocks, generate a difference value of a previous error correction counting value and a current error correction counting value among the error correction counting values, and generate permanent error block information for defining whether errors generated in the plurality of management blocks are a permanent error or a temporary error by comparing the difference value and the current error correction counting value with at least one reference value; and
a block control unit configured to replace an address signal with a new address signal when a management block selected according to the address signal among the plurality of management blocks is previously designated in the permanent error block information,
wherein the error analysis unit includes:
an error analysis period signal generation unit configured to generate an error analysis period signal according to a read command, active management block information, and a first reference value; and
an error type determination unit configured to generate the permanent error block information according to an error correction occurrence signal, the error analysis period signal, and second and third reference values,
wherein the error type determination unit includes a plurality of error type determination units corresponding to the plurality of management blocks, and
wherein each of the plurality of error type determination units includes:
a counter configured to allow a counting value of the error correction occurrence signal to be shifted to a first register from a plurality of registers when the error analysis period signal is activated;
the plurality of registers configured to sequentially shift an output of the counter according to the error analysis period signal;
a subtractor configured to generate the difference value between outputs of the plurality of registers; and
a comparator configured to generate the permanent error block information by comparing the difference value with second and third reference values, and comparing an output value output from a second register from the plurality of registers with the second and third reference values.

2. The error management system of claim 1, further comprising a block converter configured to generate active management block information which defines any one of the plurality of management blocks according to the address signal.

3. The error management system of claim 2, wherein the block converter includes:
   a rounding off logic configured to output the address signal by removing a portion of signal bits constituting the address signal; and
   a calculation logic configured to calculate which bits of an output of the rounding off logic correspond to which management block among the plurality of management blocks and output a calculation result as the active management block information.

4. The error management system of claim 2, wherein the block control unit is configured to replace the address signal with the new address signal by comparing the permanent error block information and the active management block information.

5. The error management system of claim 1, wherein signal bits constituting the error analysis period signal correspond to the plurality of management blocks.

6. The error management system of claim 1, wherein the error analysis period signal generation unit includes:
   a plurality of counters and a plurality of comparators configured in such a manner that one counter and one comparator coupled to the one counter are allocated to a corresponding one of the plurality of management blocks; and
   a selection unit configured to provide the read command to a counter of the plurality of counters which is allocated to a management block defined by the active management block information,
   wherein each of the plurality of comparators are configured to activate a signal bit corresponding to the management block to which the comparator is allocated among signal bits of the error analysis period signal when a counting value output from a counter coupled to the comparator is equal to or larger than the first reference value.

7. The error management system of claim 1, wherein the block control unit includes:
   a detection unit configured to generate a permanent error flag by comparing active management block information and the permanent error block information; and
   a block prohibition unit configured to block use of a management block corresponding to the active management block information by replacing the address signal with the new address signal based on the permanent error flag being activated.

8. A data processing system comprising:
   a processor;
   a memory system;
   a memory controller; and
   an error management system, wherein the processor, the memory system, the memory controller, and the error management system are coupled through an input and output (input/output) (I/O) bus,
   wherein a memory region of the memory system is divided into a plurality of management blocks and the memory system is configured to generate an error correction occurrence signal whenever error correction through an error correction code circuit occurs, and
   the error management system is configured to prohibit use of a management block corresponding to a permanent error by dividing errors generated in the plurality of management blocks into a temporary error and the permanent error by generating a difference value of a previous counting value and a current counting value among counting values and comparing the difference value and the current counting value with at least one reference value, and replacing an address signal which designates a management block corresponding to the permanent error among the plurality of management blocks with a new address,
   wherein the counting values are generated by counting the error correction occurrence signal,
   wherein the error management system includes:
      an error analysis unit configured to generate error correction counting values by counting the error correction occurrence signal in the plurality of management blocks and generate permanent error block information for defining whether the errors generated in the plurality of management blocks are the permanent error or the temporary error by comparing the error correction counting values and at least one reference value; and
      a block control unit configured to replace an address signal with a new address signal when a management block selected according to the address signal among a plurality of management blocks is previously designated in a permanent error block information,
   wherein the error analysis unit includes:
      an error analysis period signal generation unit configured to generate an error analysis period signal according to a read command, active management block information, and a first reference value; and
      an error type determination unit configured to generate the permanent error block information according to an error correction occurrence signal, the error analysis period signal, and second and third reference values,
   wherein the error type determination unit includes a plurality of error type determination units corresponding to the plurality of management blocks, and
   wherein each of the plurality of error type determination units includes:
      a counter configured to allow a counting value of the error correction occurrence signal to be shifted to a first register from a plurality of registers when the error analysis period signal is activated;
      the plurality of registers configured to sequentially shift an output of the counter according to the error analysis period signal;
      a subtractor configured to generate the difference value between outputs of the plurality of registers; and
      a comparator configured to generate the permanent error block information by comparing the difference value and an output value output from a second register from the plurality of registers with second and third reference values.

9. The data processing system of claim 8, further comprising a block converter configured to generate active management block information which defines any one of the plurality of management blocks according to the address signal.

10. The data processing system of claim 9, wherein the block converter includes:

a rounding off logic configured to output the address signal by removing a portion of signal bits constituting the address signal; and a calculation logic configured to calculate which bits of an output of the rounding off logic correspond to which management block among the plurality of management blocks and output a calculation result as the active management block information.

11. The data processing system of claim 9, wherein the block control unit is configured to replace the address signal with the new address signal by comparing the permanent error block information and the active management block information.

12. The data processing system of claim 8, wherein signal bits constituting the error analysis period signal correspond to the plurality of management blocks.

13. The data processing system of claim 8, wherein the error analysis period signal generation unit includes:

a plurality of counters and a plurality of comparators configured in such a manner that one counter and one comparator coupled to the one counter are allocated to a corresponding one of the plurality of management blocks; and a selection unit configured to provide the read command to a counter of the plurality of counters which is allocated to a management block defined by the active management block information; and wherein each of the plurality of comparators are configured to activate a signal bit corresponding to the management block to which the comparator is allocated among signal bits of the error analysis period signal when a counting value output from a counter coupled to the comparator is equal to or larger than the first reference value.

14. The data processing system of claim 8, wherein the block control unit includes:

a detection unit configured to generate a permanent error flag by comparing active management block information and the permanent error block information; and a block prohibition unit configured to prohibit use of a management block corresponding to the active management block information by replacing the address signal with the new address signal based on the permanent error flag being activated.

\* \* \* \* \*